United States Patent
Watanuki

(10) Patent No.: US 7,143,201 B2
(45) Date of Patent: Nov. 28, 2006

(54) EXTERNALLY ACCESSIBLE PLAYBACK APPARATUS AND METHOD

(75) Inventor: Masanori Watanuki, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 449 days.

(21) Appl. No.: 10/665,207

(22) Filed: Sep. 22, 2003

(65) Prior Publication Data

US 2004/0064624 A1  Apr. 1, 2004

(30) Foreign Application Priority Data

Sep. 27, 2002  (JP) ............................. 2002-284498

(51) Int. Cl.
*G06F 13/14* (2006.01)
*G06F 13/38* (2006.01)

(52) U.S. Cl. .............................. 710/11; 710/8; 710/14; 710/62; 710/72

(58) Field of Classification Search .................. 710/8, 710/10, 11, 33, 62, 63, 72, 74; 711/170; 713/1, 2, 100; 345/156
See application file for complete search history.

(56) References Cited

U.S. PATENT DOCUMENTS 6,487,597 B1  11/2002  Horie et al.

2002/0110073 A1 *  8/2002  Shu et al. ...................... 369/99
2003/0067814 A1 *  4/2003  Piau et al. ............. 365/189.05
2003/0172209 A1 *  9/2003  Liu et al. ....................... 710/62

FOREIGN PATENT DOCUMENTS

| JP | 2000-333285 A2 | 11/2000 |
| JP | 2001-014441 | 1/2001 |
| JP | 2002007003 A * | 1/2002 |

OTHER PUBLICATIONS

Notification of Reasons for Rejection mailed by Japanese Patent Office on Apr. 12, 2005 in Japanese Patent Application No. 2002-284498.

* cited by examiner

*Primary Examiner*—Ilwoo Park
(74) *Attorney, Agent, or Firm*—Finnegan, Henderson, Farabow, Garrett & Dunner, L.L.P.

(57) ABSTRACT

A playback apparatus including a playback unit which plays back audio information and the like, an accommodation unit which accommodates a detachable recording medium, and a controller. The controller causes the playback unit to access to the recording medium through the accommodation unit according to a first communication standard (PCMCIA) and causes an external apparatus to access to the recording medium according to a second communication standard (ATA) different from the first communication standard.

4 Claims, 3 Drawing Sheets

EXTERNALLY ACCESSIBLE PLAYBACK APPARATUS AND METHOD

CROSS-REFERENCE TO RELATED APPLICATIONS

This application is based upon and claims the benefit of priority from the prior Japanese Patent Application No. 2002-284498, filed Sep. 27, 2002, the entire contents of which are incorporated herein by reference.

BACKGROUND OF THE INVENTION

1. Field of the Invention

The present invention relates to a playback apparatus for playing back audio information and the like using a recording medium such as a PC card and the like, and more particularly to a playback apparatus for executing a communication between an external PC and a recording medium.

2. Description of the Related Art

Recently, as digital technologies become more advanced, general purpose machines such as PC (Personal Computer) and PDA (Personal Digital Assistants) and dedicated machines such as, MD (MiniDisk), CD-R players, and HDD (Hard Disk Driver) are coming into widespread.

Under the circumstances, playback apparatuses, which store audio information and the like in a memory and the like of the main body thereof as a digital file and which can easily play back the digital file, have been developed and have reached a stage of proliferation (for example, Jpn. Pat. Appln. KOKAI Publication No. 2000-333285). In these playback apparatuses, it is possible to record a digital file from a PC on the memory and the like of the main body through a communication cable and to play back the digital file. In this case, however, a PC card type HDD is not used as an external memory device, and an interface is not switched to increase a transmission speed.

It is also contemplated here to use, for example, the PC card type HDD as the recording medium, to connect the PC to the recording medium through a cable and, to record the audio information and the like from the playback apparatus to the recording medium through the cable while mounting the PC card type HDD as the recording medium on the playback apparatus. In this case, the audio information and the like can be easily recorded because it is not necessary to dismount the recording medium from the PC and to mount it on the playback apparatus again.

However, when the audio file and the like are transmitted from the PC to the playback apparatus through a USB (Universal Serial Bus) cable, the audio file and the like received through the USB cable are transmitted to the recording medium connected to the playback apparatus at a very slow transmission speed of, for example, 0.5 M byte/sec. because they are transmitted through a PCMCIA interface under the control of the controller of the playback apparatus. Accordingly, even if the audio file and the like are transmitted from the PC to the playback apparatus at a transmission speed of, for example, 8 M bytes/sec through a USB 2.0 cable having a transmission speed as fast as that of the IEEE1394 communication standard, there is a problem that the recording speed of them on the PC card type HDD mounted on the playback apparatus is very slow because the transmission speed of the PCMCIA communication standard in the playback apparatus is very slow.

That is, in the conventional playback apparatus, when an audio file and the like are recorded from an external PC and the like on a recording medium mounted on the playback apparatus, a problem arises in that even if the transmission speed between the external PC and the playback apparatus is fast, a sufficient transmission speed cannot be obtained because the PCMCIA communication standard is employed between the playback apparatus and the recording medium, and thus a recording speed is made slow.

BRIEF SUMMARY OF THE INVENTION

An embodiment of the present invention is a playback apparatus characterized by including a playback unit which plays back predetermined information, an accommodation unit which accommodates a detachable recording medium, and a controller which causes the playback unit to access to the recording medium accommodated in the accommodation unit according to a first communication standard (PCMCIA) and causing an external apparatus to access to the recording medium according to a second communication standard (ATA/USB) different from the first communication standard.

DETAILED DESCRIPTION OF THE INVENTION

Figure 1:
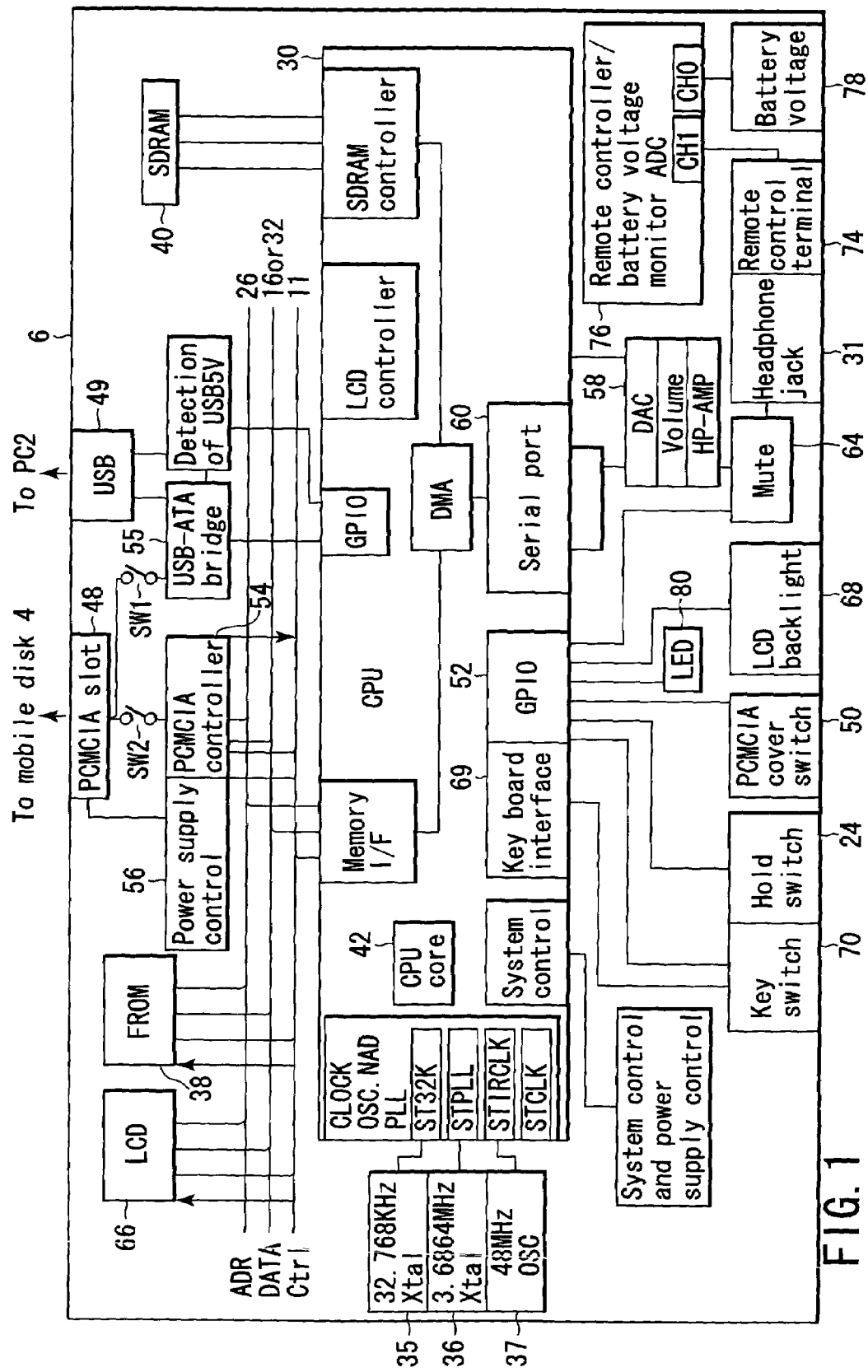
FIG. 1 is a block diagram showing one embodiment of a playback apparatus according to the present invention.
Figure 2:
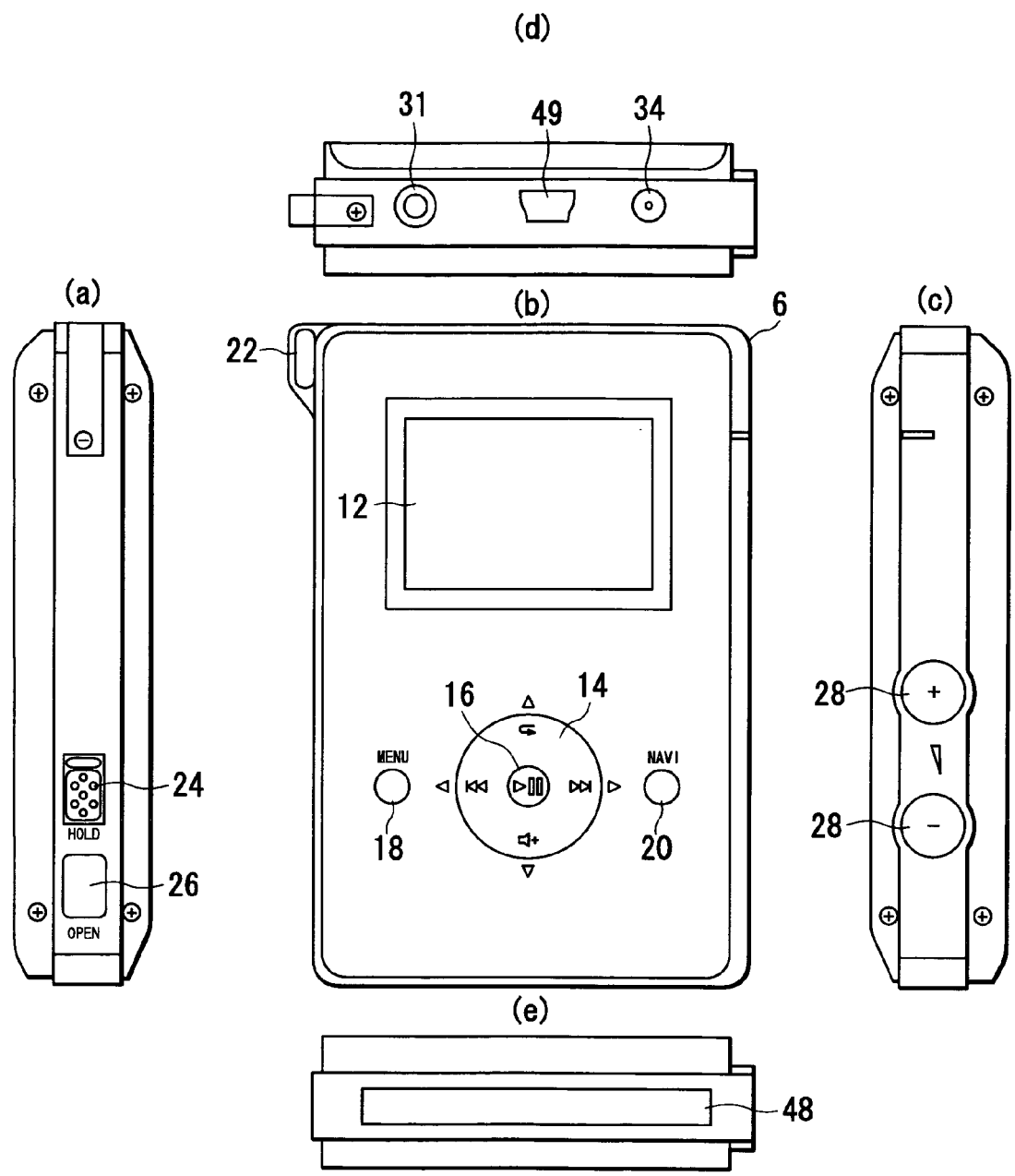
FIG. 2 is schematic view showing an outline of the embodiment of the playback apparatus according to one embodiment of the present invention.

A playback apparatus according to one embodiment of the present invention will be described below in detail with reference to the drawings. FIG. 1 is a block diagram showing an embodiment of the playback apparatus according to one embodiment of the present invention, and FIG. 2 is schematic view showing an outline of the embodiment of the present invention.

(Playback Apparatus According to the Present Invention)

When the playback apparatus 6 according to the one embodiment of present invention accesses to a mobile disk 4 such as a PC card type HDD and the like in a playback mode to read an audio file and the like stored therein, the playback apparatus 6 accesses thereto according to the PCMCIA communication standard, and when an external PC 2 and so on access to the mobile disk 4 such as the PC card type HDD and the like through a USB 2.0 cable etc. to record an audio file and the like thereon, the external PC 2 and so on access thereto according to the ATA communication standard so that the audio file and the like can be recorded therefrom without sacrificing the transmission speed of the USB 2.0 cable.

That is, one embodiment of the present invention is the playback apparatus 6 characterized by including a playback unit for playing back predetermined information, an accommodation unit for accommodating a detachable recording medium, and a controller for causing the playback unit to access to the recording medium accommodated in the accommodation unit according to a first communication standard (PCMCIA) and causing an external apparatus to access to the recording medium according to a second communication standard (ATA/USB) different from the first communication standard.

With the above structure, when the audio file and the like recorded on the PC card type HDD mounted on the playback apparatus 6 is played back in the one embodiment of present invention, a communication is executed between the controller having a playback function and the PC card type HDD according to the PCMCIA standard. In contrast, when an audio file and the like are supplied from the external PC and the like to the main body of the playback apparatus 6 through, for example, the USB 2.0 cable, etc., they are recorded on the PC card type HDD and the like mounted on the playback apparatus 6 according to the ATA standard in place of the PCMCIA standard, thereby a transmission speed of, for example, 8 M bytes/sec and the like can be achieved.

At this time, a signal from the PC 2 is not controlled by a CPU 30 acting as the controller of the playback apparatus 6, and a signal from, for example, a USB terminal is turned on and off by a switch element through a USB-ATA bridge 55 and supplied to the PC card type HDD through a PCMCIA slot. With this arrangement, the PC 2 and the PC card type HDD can execute communication processing according to the USB communication standard and the ATA communication standard so that a transmission speed of about 8 M bytes/sec can be realized, thereby an enhancement of a transmission speed, which is about 16 times that of, for example, 0.5 M byte/sec according to the PCMCIA communication standard, can be expected.

(Arrangement)

In the playback apparatus 6 according to one embodiment of the present invention, the CPU 30 acting as the controller executes decoding of audio data, file system management, user interface control, and the like as shown in FIG. 1. Further, a 32.768 kHz vibrator 35, a 3.6864 MHz vibrator 36, and a 48 MHz oscillator 37 are mounted on the playback apparatus 6 to generate clocks of the CPU 30. The 48 MHz oscillator 37 oscillates when the CPU 30 is in a RUN mode or in an IDLE mode. Further, firmware having respective functions is stored in a NOR type flash memory (FROM) 38 as a program. This program is expanded on an SDRAM 40 and executed. The SDRAM 40 is also used as an audio data buffer. It is preferable to use a low power consumption device with a small self refresh current as the SDRAM 40 to reduce power consumption in a standby state.

A PCMCIA type II slot 48 acting as the accommodation unit is mounted on the playback apparatus 6 as an interface to the mobile disk 4. The output terminal of the PCMCIA slot 48 is connected to a PCMCIA controller 54, which will be described later, through a switch element SW2 that is turned on and off by the CPU 30. Note that the switch element SW2 may be provided as a switch function built-in the PCMCIA controller 54.

A lid 11 is provided with the card insertion unit (slot), and a detection signal from a switch 50 acting as an open/close sensor for detecting an open/close state of the lid is supplied to a GPIO 52 of the CPU 30. The GPIO52 can be set as an interrupt.

The operation voltage of the mobile disk 4 is set only to, 3.3 V as an example. It is possible to turn on and off a power supply to the mobile disk 4 by the CPU 30. The operation of only the mobile disk 4 is guaranteed. However, even if other card is connected, the main body of the playback apparatus 6 and the card are not damaged.

Further, the playback apparatus 6 is provided with a USB terminal (USB 2.0) 49, and an output therefrom is supplied to a USB5V detection unit and further to the USB-ATA bridge 55. An output from the USB-ATA bridge 55 is supplied to an end of a switch element SW1, and the other end thereof is connected to the PCMCIA slot 48. The switch element SW1 is turned on and off by the CPU 30. Note that the switch element SW1 may be provided as a switch function built-in the USB-ATA bridge 55.

Since the mobile disk 4 cannot be driven by the current capacity of a power supply switch in the PCMCIA controller 54, a power supply control circuit 56 to the mobile disk 4 is provided externally of the controller 54. The power supply is controlled by setting a register of the controller 54.

Further, a DAC+headphone amplifier 58, which has an equalizer (EQ) function of the Bass and Treble of a played-back tone and a volume control function, is used in an audio output unit. The equalizer executes only Boost and no equalizer in a negative direction is provided.

Audio digital data output from the CPU 30 is supplied to the digital data input pin of the DAC 58 through a serial port 60 of the CPU 30. Further, a mute circuit 64 is disposed externally of the DAC 58 to prevent pop noise generated when the power supply is turned on and off.

A LCD (Liquid Crystal Display) controller built-in the CPU 30 is not used to control a liquid crystal display screen 12, and the liquid crystal display screen 12 is provided with an LCD driver with built-in RAM 66 which is connected to a data bus of the CPU 30. A blue back lights 68 (three sets) are connected to the GPIO 52 of the CPU 30 as back lights.

A hold switch 24 is also connected to the GPIO 52 of the CPU 30. Each of push switches such as a cross key 14, an enter key 16, mode switch keys 18 and 20, and the like is composed of a key matrix type switch 70. A column signal is supplied to a key board interface 69 of the CPU 30, and a row signal is supplied to the GPIO 52.

A headphone terminal 31 has four pins, one of the pins is used as a remote control terminal 74, and a remote control signal from a remote controller is supplied to a remote controller/battery voltage monitor ADC 76. A power supply (pull-up power supply) used in the remote controller is turned on and off by the CPU 30. To reduce current consumption, when the remote controller is not operated (the CPU 30 is in a standby state), the pull-up voltage can be turned off.

The voltage drop of a battery is detected by a voltage detector IC 78 and notified to the CPU 30 by interrupt. The battery is charged under the control of a charge IC. The charge operation of the battery is started and stopped by hardware. The battery is charged when an AC adapter is connected thereto. An LED 80 shows a charged state of the battery. A bi-color LED, for example, and orange color and a green color LED is used as the LED 80. The LED 80 are controlled by the charge IC and is not controlled by the CPU 30.

A view of (a) in FIG. 2 is a left side elevational view of the playback apparatus according to one embodiment of the present invention, a view of (b) is a front elevational view thereof, a view of (c) is a right side elevational view thereof, a view of (d) is an upper side elevational view thereof, and a view of (e) is a lower side elevational view thereof. As shown in (e), the playback apparatus has the insertion port of the slot which is formed on a lower side and into which the storage device 4 is inserted, and the lid 11 is disposed on the insertion port. The lid 11 is provided with the open/close sensor described above so that when the lid 11 is opened while audio is being played back, the playback thereof is interrupted at once. The open/close sensor may be arranged, for example, such that a projection is disposed on the inside of the lid 11 and a press sensor is located at a position corresponding to the projection in a cabinet, or such that a light emitting element and a light receiving element are disposed in the cabinet and a light reflection sheet is disposed at a position corresponding to the light emitting element inward of the lid 11 so that the light emitted from the light emitting element is reflected by the light reflecting sheet of the closed lid 11 and incident on the light receiving element. Although not shown, the battery is accommodated on the back surface of the storage device 4.

As shown in (b) in FIG. 2, the monochromatic liquid crystal (STN liquid crystal) display screen 12 of, for example, 1.8 inch is disposed on the front surface of the playback apparatus 6 at an upper portion thereof. For example, 160×120 dots are contemplated as the number of pixels of the display screen 12, and the blue LEDs (three sets) are preferably used as the back lights. Disposed on the front surface of the playback apparatus 6 at a lower portion thereof are the circular cross key 14, the enter key 16 located at the center of the cross key 14, and the MENU key 18 and the navigation key 20 both acting as the mode switch keys on both the sides of the cross key 14. The cross key 14 has switching positions of keys (RIGHT, LEFT, UP, DOWN) at upper, lower, right and left positions, and the functions of the respective keys are switched according to operation modes as described later. A strap holder 22 is formed at an upper left portion of the playback apparatus 6.

As shown in (a) in FIG. 2, a HOLD switch 24 and an OPEN switch 26 are disposed on the left side surface of the playback apparatus at lower portions thereof. The hold switch 24 locks the respective keys and also locks the slot lid 11 on the lower side surface. The open switch 26 is a switch for opening the lid 11. When the hold switch 24 is turned on, the open switch 26 is made ineffective at the same time.

Figure 5:
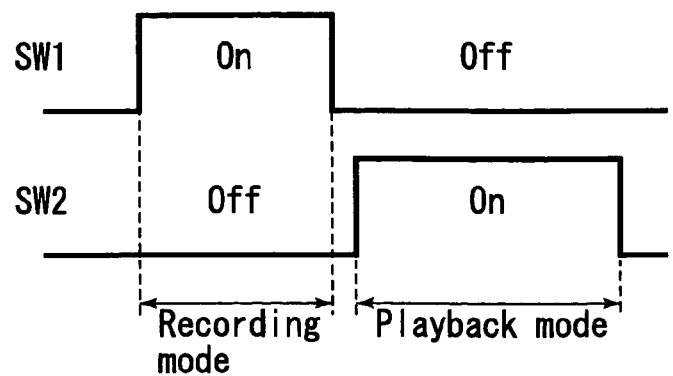
FIG. 5 is a timing chart showing an example of the switching operation of the playback apparatus according to one embodiment of the present invention.

As shown in (c) in FIG. 2, "+" and "−" volume keys 28 are disposed on the right side surface of the playback apparatus. Further, as shown in (d) in FIG. 2, the headphone terminal 31, a USB terminal (USB 2.0) 49, which is connected to the PC 2, and the like, and a power supply terminal 34, to which the AC adapter is connected, are disposed on the upper side surface of the playback apparatus. A stereo mini headphone (with a remoter controller) 8 shown in FIG. 5 is connected to the headphone terminal 31. The remote controller is also provided with six keys NEXT, PREV, EQ, PLAY/PAUSE, VOL+, and VOL−likewise.

The operation modes of the respective keys include a menu mode, a navigation (NAVI) mode, a recording mode, playback mode, and the like. The playback mode is a mode for playing back an audio file and the like, the navigation mode is a mode for selecting an audio file and the like to be played back and can specify the audio file by displaying the directory structure of audio files. The recording mode is a mode for recording an audio file and the like from the PC 2, which will be described later, on the mobile disk 4. The menu mode is a mode for making various types of setting such as setting of a tone (equalizer), setting of playback to be repeated, selection of a language to be displayed, and the like.

Note that, in the navigation mode, rightward/leftward movement of a cursor selects a directory, and the cursol reaches an upper level of the directory by moving leftward, reaches a lower level of the directory by moving rightward, and selects a holder and a file by moving upward and downward in the directly.

(Detailed Description of Interface Switching Operation)

Figure 3:
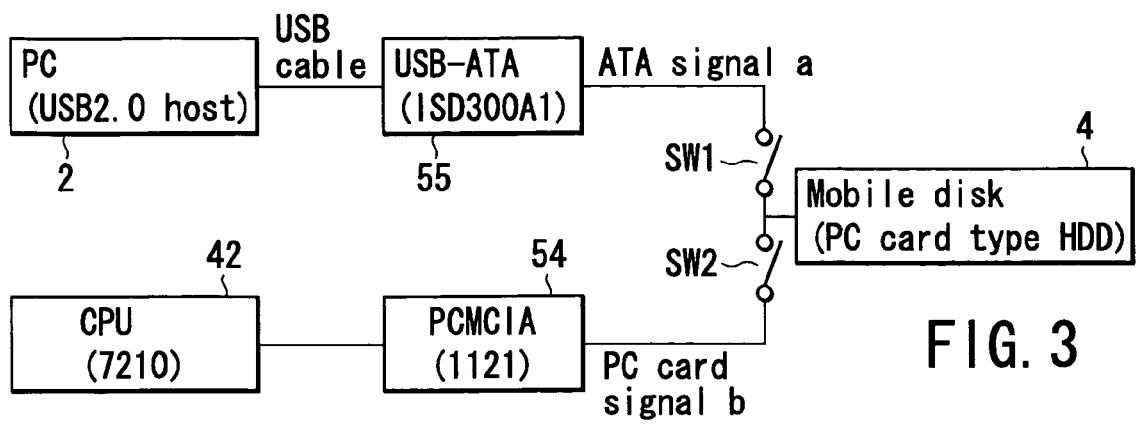
FIG. 3 is a view briefly explaining an example of a signal path between the playback apparatus according to one embodiment of the present invention and a peripheral apparatus.

Next, an interface switching operation, which is a feature of the playback apparatus 6 according to one embodiment of the present invention, will be described below in detail. FIG. 3 is a view briefly explaining an example of a signal path between the playback apparatus 6 and a peripheral apparatus, FIG. 4 is a view explaining connection between the playback apparatus 6 and the peripheral apparatus, and FIG. 5 is a timing chart showing an example of the switching operation of the playback apparatus 6.

Figure 4:
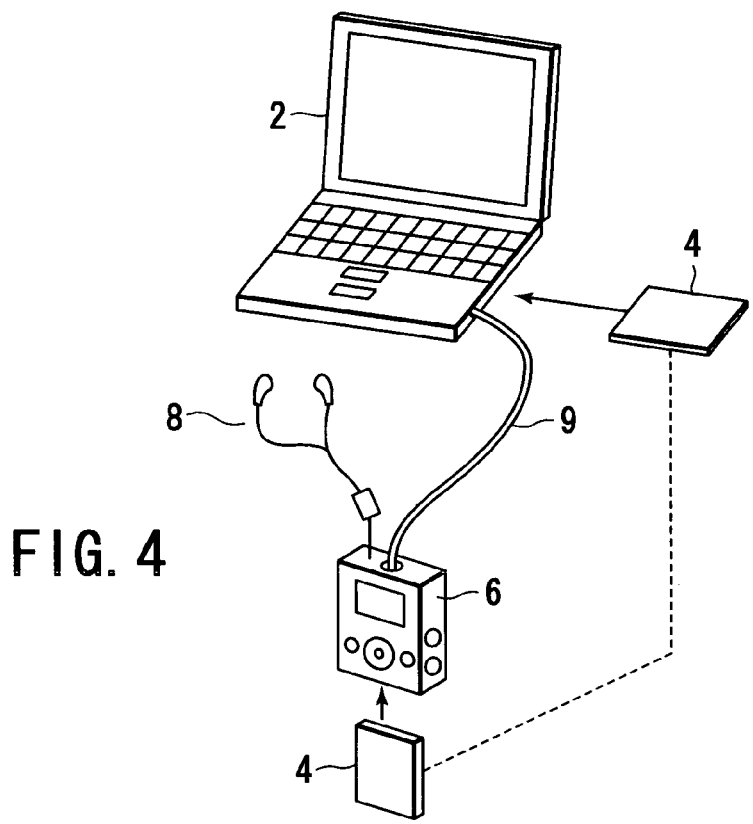
FIG. 4 is a view explaining connection between the playback apparatus according to one embodiment of the present invention and the peripheral apparatus.

First, as shown in FIG. 4, the playback apparatus 6 according to one embodiment of the present invention is connected to the peripheral apparatus. That is, the playback apparatus 6 is connected to the PC 2 through a USB cable 9. Further, the mobile disk 4 such as an IC card or the like is inserted into a card insertion port (slot) of the PC 2 or inserted into the PCMCIA card slot 48 acting as the accommodation unit of the playback apparatus 6. Further, the headphone 8 is connected to the headphone jack 31 of the playback apparatus 6.

In the playback mode and the recording mode described above, the playback apparatus 6 according to one embodiment of the present invention forms connection paths as shown in FIG. 3 according to the above connection. That is, in the recording mode, an audio file and the like are supplied from the external PC 2 to the USB-ATA bridge 55 through the USB cable 9 and the USB terminal 49. The signal of the audio file and the like is converted into an ATA signal a in the USB-ATA bridge 55 and supplied to the mobile disk 4 through the switch element SW1. Here, the signal of the audio file and the like according to the USB 2.0 is transmitted as the ATA signal a of the ATA standard in place of a PC card signal b of the PCMCIA standard. Accordingly, it is possible to record the audio file and the like on the mobile disk 4 acting as, for example, the PC card type HDD through the PCMCIA slot 48 acting as the accommodation unit while making use of the high speed transmission speed of the USB. 2.0.

The operating states of the switch elements SW1 and SW2 at this time are shown in the timing chart of FIG. 5. As an example, the switch elements SW1 and SW2 are controlled by the CPU 30 or a CPU core 42 such that switch element SW1 is turned on and the switch element SW2 is turned off in the recording mode and that the switch element SW1 is turned off and the switch element SW2 is turned on in the playback mode. Further, these switch elements may be built-in the USB-ATA bridge 55 and the PCMCIA controller 54, respectively.

Further, in the playback mode, the CPU core 42 is connected to the the mobile disk 4 through the PCMCIA controller 54 and the switch element SW2 so that a PCMCIA signal, that is, the PC card signal b is supplied therethrough and an audio file and the like recorded on the mobile disk 4 is read out. As described above, in the playback mode, the switch elements SW1 and SW2 are controlled by the CPU 30 or the CPU core 42 such that the switch element SW1 is turned off and the switch element SW2 is turned on.

As described above, in the playback apparatus 6 according to one embodiment of the present invention, the USB standard is converted into the ATA communication standard using the USB-ATA bridge 55 to make use of the transmission speed of the USB 2.0 in the recording mode, thereby contents information such as an audio file and the like can be directly recorded on the mobile disk 4 acting as the PC card type HDD from the PC 2 without being controlled by type CPU 30 and the like. The transmission speed at the time is, for example, about 8 M bytes/sec, which enables recording processing to be executed at a high speed that is about 16 times the transmission speed of about 0.5 M byte/sec when the recording processing is executed under the control of the CPU 30 and the like according to the PCMCIA standard. With the above operation, an audio file and the like can be recorded to the playback apparatus through the communication cable at a very high speed that is by no means inferior to the speed at which the audio file and the like are written to the PC card type HDD directly connected to the PC 2.

Although persons skilled in the art can realize the present invention by the various embodiments described above, they can easily make various modifications of the embodiments and apply the modifications to the various embodiments without the need of inventive capability. Accordingly, the present invention covers a wide rage of embodiments as long as they are not contradictory to the disclosed principles and the novel features of the invention, and thus the present invention is by no means limited to the above embodiments.

For example, although the USB communication standard, the ATA communication standard and the PCMCIA communication standard have been described above as examples of the communication standard, the present invention is by no means limited thereto and can achieve the same operation/working effect also in other communication standards.

As described above in detail, according to the present invention, there can be provided the playback apparatus capable of writing an audio file and the like to the external memory device mounted thereon even if the external memory device is a detachable external memory device by directly recording the audio file and the like from a PC according to the USB communication standard, the ATA communication standard, and the like using a different interface in the playback mode and the recording mode.

What is claimed is:

1. A playback apparatus comprising:
   a playback section configured to play back predetermined information;
   a storage section that stores a removable recording medium; and
   a controller configured to enable a PCMCIA standard when the playback section accesses the recording medium in the storage section, and to enable an ATA standard when an external apparatus accesses the recording medium, the ATA standard using ATA standard signals obtained by converting USB standard signals supplied from the external apparatus.

2. A playback apparatus, comprising:
   a playback section configured to play back predetermined information;
   a storage section that stores a removable recording medium;
   a USB-ATA bridge configured to receive USB standard signals from an external apparatus and convert the USB standard signals into ATA standard signals;
   a first switch configured to receive the ATA standard signals from the USB-ATA bridge and supply the received ATA standard signals to the storage section;
   a second switch located between the playback section and the storage section; and
   a controller configured to enable a PCMCIA standard by turning off the first switch and turning on the second switch when the playback section accesses the recording medium in the storage section, and to enable the ATA standard when the external apparatus accesses the recording medium.

3. A method for accessing a playback apparatus, comprising:
   detecting a removable recording medium in a storage section of the playback apparatus;
   determining that the recording medium is being accessed by one of a playback section of the playback apparatus and an external apparatus;
   enabling a PCMCIA standard when the recording medium is accessed by the playback section; and
   enabling an ATA standard when the recording medium is accessed by the external apparatus, such that the ATA standard uses ATA standard signals obtained by converting USB standard signals supplied from the external apparatus.

4. A method for accessing a playback apparatus, comprising:
   detecting a removable recording medium in a storage section of the playback apparatus;
   determining that the recording medium is being accessed by one of a playback section of the playback apparatus and an external apparatus;
   turning off a first switch and turning on a second switch to enable a PCMCIA standard when the recording medium is accessed by the playback section, wherein the first switch is configured to receive ATA standard signals from a USB-ATA bridge and to supply the received ATA standard signals to the storage section, and the second switch is located between the playback section and the storage section to enable the PCMCIA standard; and
   turning on the first switch and turning off the second switch to enable an ATA standard when the recording medium is accessed by the playback section,
   wherein the USB-ATA bridge is configured to receive USB standard signals from the external apparatus and convert the USB standard signals into the ATA standard signals.

* * * * *